United States Patent [19]

Aihara et al.

[11] Patent Number: 4,870,379
[45] Date of Patent: Sep. 26, 1989

[54] SUPERCONDUCTING SWITCHING DEVICE

[75] Inventors: Katsuzo Aihara, Hitachiota; Nobuhiro Hara; Naofumi Tada, both of Hitachi; Masahiro Ogihara, Katsuta; Katsuo Kouriki, Hitachi; Yasuo Suzuki, Takahagi, all of Japan

[73] Assignee: Hitachi, Ltd., Tokyo, Japan

[21] Appl. No.: 268,203

[22] Filed: Nov. 7, 1988

[30] Foreign Application Priority Data

Jan. 29, 1988 [JP] Japan .................. 63-16967

[51] Int. Cl.$^4$ .............................................. H01F 7/22
[52] U.S. Cl. ...................................... 505/1; 335/216; 338/325
[58] Field of Search ............ 335/216; 174/15.4, 125.1; 338/325; 505/1

[56] References Cited

U.S. PATENT DOCUMENTS 4,803,456  2/1989  Benesch ............................. 338/325

FOREIGN PATENT DOCUMENTS 62-1276  2/1981  Japan .
59-111381  12/1982  Japan .

OTHER PUBLICATIONS

Superconductor Reverses Magnetic Field, p. 39, Jun. 25, 1962, C & EN.

Primary Examiner—George Harris
Attorney, Agent, or Firm—Antonelli, Terry & Wands

[57] ABSTRACT

In a superconducting switching device including a switching member comprising a superconducting wire, and a magnetic field generation section for controlling superconducting-normal conducting transition caused in the switching member, the switching member comprises an oxide superconductor having a high critical temperature and having a large electric resistivity value under the normal conductive state.

5 Claims, 4 Drawing Sheets

SUPERCONDUCTING SWITCHING DEVICE

BACKGROUND OF THE INVENTION

The present invention relates to a superconducting switching device, and in particular to a superconducting switching device suitable for use in a flux pump, a superconducting rectifier, and a persistent current switching.

Such a superconducting switching device of the prior art is shown in FIG. 2A. In FIG. 2A, numeral 1 denotes a switching member comprising a superconducting wire, which contains Nb or Nb-1% Zr alloys. Numeral 2 denotes a coil for applying a magnetic field. And the superconducting switching device is normally used under the state that it is immersed in liquid helium FIG. 2B shows the magnetic field versus critical current density characteristics of Nb-1% Zr which is an example of the superconducting wire 1 used in FIG. 2A. The origin side of a curve 3 exhibits a superconductive state where the electric resistance is zero. This state corresponds to the ON-state. If a current is let to flow through the magnetic field applying coil 2 to apply such a magnetic field as to cause a state located at the outside of the curve 3, the normal conductive state is caused and a finite electric resistance is generated. This state corresponds to the OFF-state. When the current flowing through the magnetic field applying coil 2 is stopped, the ON-state is restored. The ON-OFF switching operation is thus performed.

JP-A-59-111381, for example, relates to such a device or apparatus.

Since a conventional superconducting switching device is configured as described above, the electric resistivity of the switching member 1 under the normal conductive state is as small as 5 to 20 $\mu\Omega$cm, a favorable switching effect being hardly obtained. The electric resistance can be raised by making the length of the superconducting wire long. However, this results in a drawback that the volume of the switching member 1 becomes large and the necessary dimension of the magnetic field applying coil 2 also becomes large. Further, the critical magnetic field of the switching member 1 is as large as 0.4 to 0.81 T. This results in a drawback that a large-sized magnetic field applying coil 2 is needed in order to perform normal conductive transition.

SUMMARY OF THE INVENTION

In view of the above described points, therefore, an object of the present invention is to provide a superconducting switching device which performs a favorable switching operation with a weak magnetic field applied.

According to the present invention, there is provided a superconducting switching device including a switching member comprising a superconducting wire, and a magnetic field generation section for controlling superconducting-normal conducting transition caused in said switching member, said switching member comprising: an oxide superconductor having a high critical temperature and having a large electric resistivity value under the normal conductive state.

Thus, the above described object is achieved by using the oxide superconductor having a high critical temperature value and a large electric resistivity under the normal conducting state instead of using a conventional superconducting wire as the switching member.

In accordance with the present invention, a characteristic of new kind, which has been first found as a result of detailed measurement of the magnetic field versus critical current density characteristic of an oxide superconductor having a high critical temperature value, is applied to a switching device.

DESCRIPTION OF THE PREFERRED EMBODIMENTS

Figure 1:
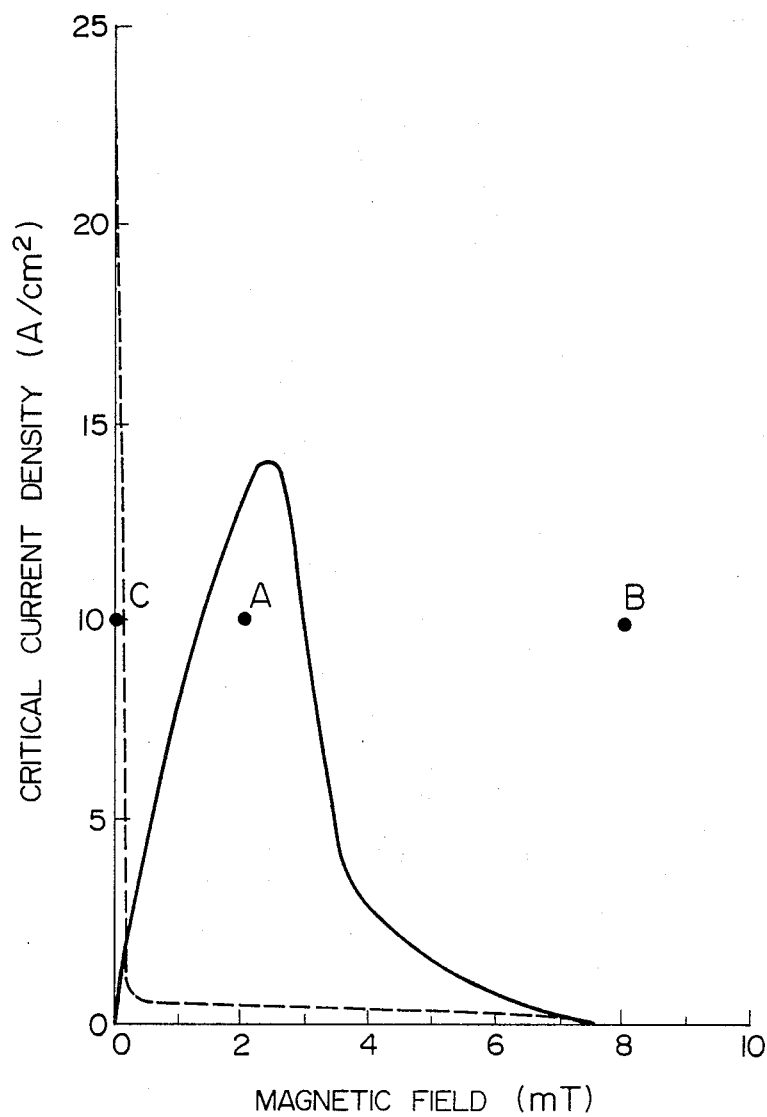
FIG. 1 is a characteristic diagram showing the magnetic field versus critical current density relationship of an oxide superconductor used for the explanation of the present invention.
Figure 2A:
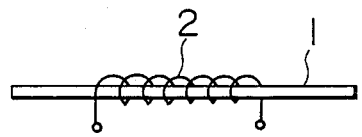
FIG. 2A is a schematic diagram showing a switching structure.
Figure 2B:
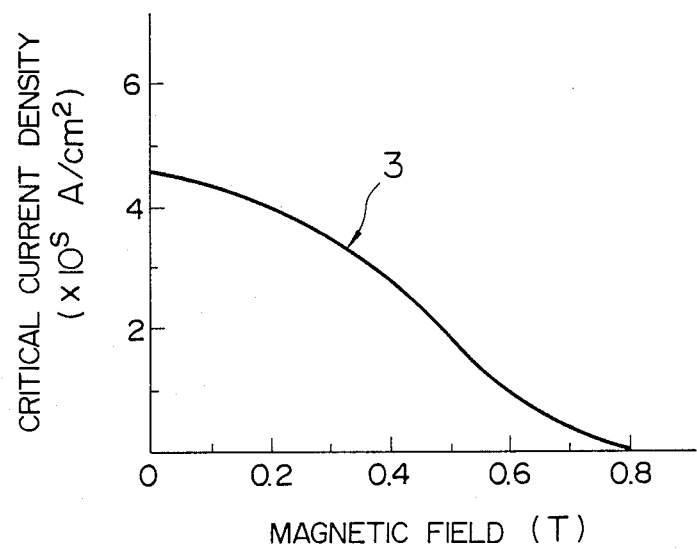
FIG. 2B is a characteristic diagram showing the magnetic field versus critical current density relationship of a Nb-1% Zr superconducting wire material of the prior art.

FIG. 1 shows the magnetic field versus critical current density characteristic obtained. The sample is an oxide superconductor represented as $Y_1Ba_2Cu_3O_{7-\delta}$ and is cut out from a disk-shaped sintered pellet which is obtained by mixing raw material powders of $Y_2O_3$, CuO and $BaCO_3$, press-forming them and thereafter calcining them. Measurement was performed by immersing the sample in liquid nitrogen and applying a magnetic field to the sample by using an external magnetic field generation apparatus. A superconducting magnet with Nb-Ti multifilament superconducting wire wound around it was used in the magnetic field generation apparatus. As shown in FIG. 1, a critical current density of 23 A/cm$^2$ was first exhibited at a magnetic field of zero. As the applied magnetic field was increased, the critical current density abruptly decreased as indicated by a broken line. The critical current density became nearly zero in the magnetic field of 7 mT. When the magnetic field was then weakened, the critical current density increased as indicated by a solid line and reached its peak in the vicinity of 3 mT. Thereafter, the critical current density lowered again. Even when the external magnetic field was made equal to zero, the critical current density became a very low level. Even if the magnetic field is strengthened or weakened thereafter, the critical current density shifted on the curve indicated by the solid line. Such a characteristic was not found in conventional superconductors, but is a phenomenon which has been first found in the oxide superconductor. The magnetic field indicated on the abscissa of FIG. 1 is represented by values converted from the conduction currents of the superconducting magnet. It is considered that such a phenomenon is caused because magnetic flux lines are rapped within the sinter sample or because of remanent magnetic field induced in the superconductive magnet. At present, however, definite solution of the cause is not obtained.

In a superconducting switching device according to the present invention, the magnetic field versus critical current density characteristic indicated by the solid line of FIG. 1 is applied. For this purpose, it is necessary to make the switching member experience a magnetic field which is equal to or stronger than the critical magnetic field. This is easily achieved by causing a current to flow through a magnetic field applying coil making up the switching device.

In FIG. 1, the upper part of the magnetic field-critical current density characteristic curve represents the normal conductive state and the lower part thereof represents the superconductive state. In accordance with the present invention, it is possible to generate the ON-state, i.e., the superconductive state by applying a certain magnetic field as indicated by a point A, for example. On the contrary, it is possible to generate the OFF-state, i.e., the normal conductive state by further strengthening the applied magnetic field as indicated by a point B or by making the applied magnetic field equal to zero as indicated by a point C, on the contrary.

In particular, it was not predictable in superconductors of the prior art that the switching operation becomes possible by making the applied magnetic field zero as indicated by the point C. This has been made possible for the first time by the present invention.

This has significant meaning in controlling the superconducting-normal conducting transition because the ON-state and OFF-state of the switching member are possible in either of two states, i.e., the ON state and the OFF state of the control coil. As for the applied magnetic field required for the switching operation, a weak magnetic field suffices which is one several-tenths of the intensity of the prior art.

Further, the critical temperature of the same sample as that used in FIG. 1 was measured by using the four-terminal resistance method. As a result, the onset point of superconducting was 91° K., and the mid point and the end point of transition were 89° K. and 88° K., respectively. The electric resistivity at the onset point of superconducting was 1.2 mΩcm. This value of electric resistivity is larger than that of a superconductor of the prior art by two figures or more.

Embodiments of the present invention will now be described.

EMBODIMENT-1

Figure 3:
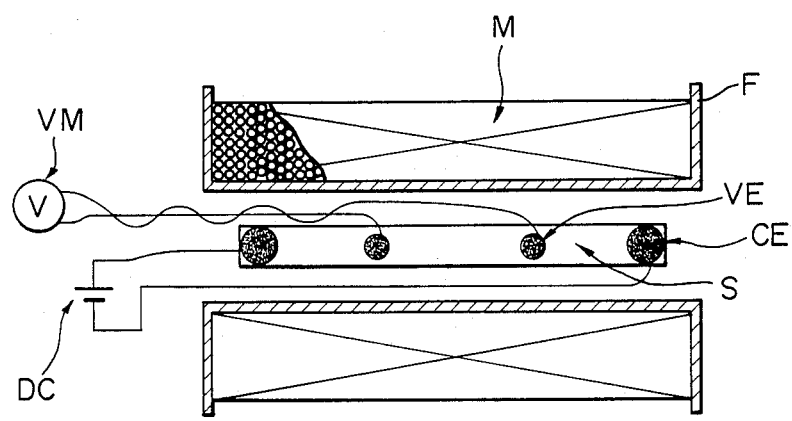
FIG. 3 is a schematic view of a device structure according to the present invention.

From the same disk-shaped sintered pellet as that described above and used in FIG. 1, a bar having a straight angle, width of 2 mm, thickness of 1 mm and length of 45 mm was cut out to form a switching member. An electrode of metal indium was formed on this switching member by an ultrasonic soldering iron. As the magnetic field applying coil, an electromagnet having a space with diameter of 5 mm and having length of 50 mm was made by solenoid-winding an enameled copper wire. The switching member wa inserted into this magnetic field applying coil and fixed to form a switching device. FIG. 3 is a schematic view of the device structure, wherein M depicts the electromagnet for applying a magnetic field, F coil frame, DC direct power source, VM voltmeter, VE voltage detecting electrode, CE current detecting terminal, and S switching member.

Figure 4:
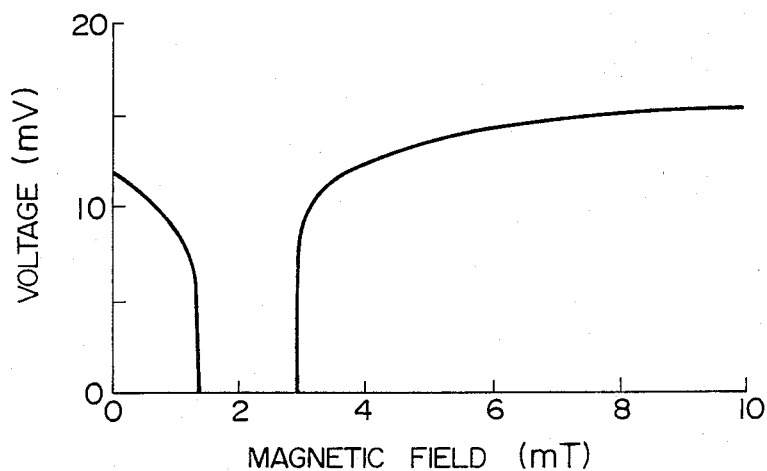
FIG. 4 is a magnetic field versus voltage characteristic diagram in an oxide superconductor of the present invention.

This switching device was immersed into liquid nitrogen and its switching operation was checked. First of all, a direct current source was connected to the magnetic field applying coil to generate a magnetic field of 10 mT, and then the magnetic field was weakened to zero. Succeedingly, a DC power source was connected to the switching member to let flow a constant current of 0.2 A. Under that state, the applied magnetic field was swept to measure voltage generated in the switching member. The result is shown in FIG. 4. In FIG. 4, voltage of 12 mV was generated when the magnetic field was zero. The voltage gradually lowered as the magnetic field was strengthened, and the voltage became zero at 1.3 mT. When the magnetic field was further strengthened, a voltage generation was observed again at 3 mT. Zero voltage corresponds to the superconductive state. The superconducting-normal conducting transition corresponding to the magnetic field versus critical current density characteristic shown in FIG. 1 was thus confirmed.

Figure 5:
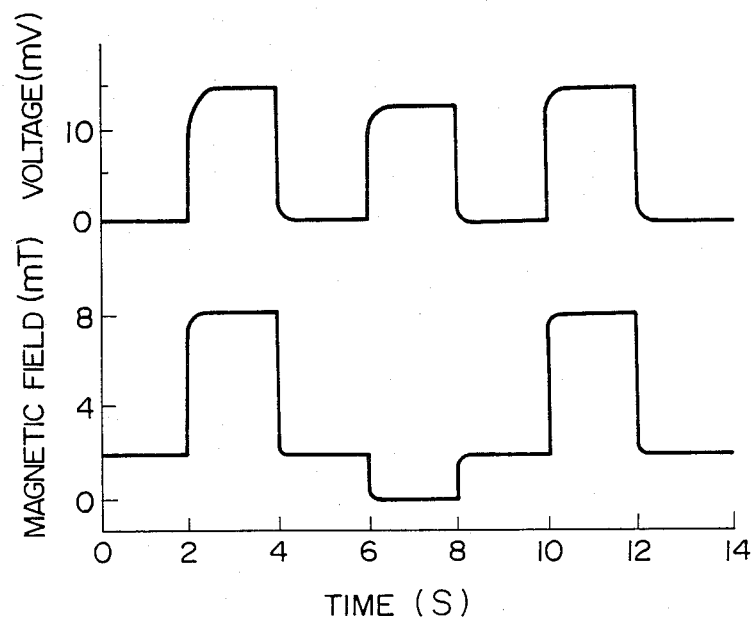
FIG. 5 is a characteristic diagram showing the change of voltage obtained when the magnetic field is changed in a pulsive way under the state that a current of 0.2 A is let to flow through a switching member of the present invention.

In order to observe the switching speed, the magnetic field was changed pulsatively as 0 mT→2 mT→ 8 mT→2 mT→0 mT under the state that 0.2 A was let to flow through the switching member and the voltage change was observed. The result is shown in FIG. 5. The voltage changed in response to the change in magnetic field. Switching time delays were scarcely found and favorable switching characteristics were obtained.

In the present embodiment, the switching operation in liquid nitrogen has been described. In liquid helium as well, however, similar function was confirmed.

Further, in the present embodiment, an oxide superconductor was used as it was as the switching member. For the purpose of mechanical reinforcement, however, the oxide superconductor may be combined with a conductor such as metal or an alloy or with an insulator. Further, a wire-shaped superconductor may be used in the form a coil.

Further, a superconducting coil may also be used as the magnetic field applying coil, and its coil shape is not especially limited. Coil winding directly on the switching member is also permissible.

EMBODIMENT - 2

A switching member made in the same way as the embodiment 1 was inserted into two electromagnets having a space of 5 mm in diameter, length of 50 mm, and coaxially wound coils to make a switching device. The inner electromagnet was used for generating the bias magnetic field, and the outer electromagnet was used for controlling the superconducting-normal conducting transition. These two electromagnets were individually connected to power sources and so set that generated magnetic fields might be opposite each other in direction.

Because the electromagnet for generating the bias magnetic field was provided, the position of the magnetic field whereat the critical current density as shown in FIG. 1 had its peak could be easily controlled.

EMBODIMENT -3

An electromagnet was made by winding an enameled copper wire around a permanent magnet cylinder having an inside diameter of 5 mm, an outside diameter of 15 mm and length of 50 mm. A switching member similar to that of the embodiment 1 was inserted into the electromagnet to make a switching device.

The intensity of the magnetic field within the permanent magnet cylinder was defined to be 2 mT. The circuit was so configured that the outside electromagnet might generate a magnetic field which was opposite in direction to that of the permanent magnet.

Since a permanent magnet is used in the present embodiment, the control circuit for generating the bias magnetic field becomes advantageously unnecessary.

EMBODIMENT -4

Two switching devices similar to the switching device of the embodiment 2 was made. Superconducting-normal conducting transition control electromagnets of both switching devices were connected in series and connected to one power source circuit. Electromagnets for generating bias magnetic fields were connected to individual power sources. Bias magnetic fields were so set as to give the strength at the above described point A of FIG. 1 by one magnet and to give the strength at the point C by the other magnet. When currents were let to flow through the control electromagnet circuits under this condition, one switching device turned ON and the other switching device turned OFF. When currents of the control electromagnet circuits were stopped, the mentioned one switching device turned OFF and the other switching device turned ON.

In the present embodiment, the oxide superconductor is used in the switching member of the switching device. Therefore, the electric resistivity under normal state is large. Since the switching device operates with a weak applied magnetic field, a smaller switching device than the conventional one is obtained. Further, the critical temperature is high, and hence its use in liquid nitrogen which has been impossible in the prior art becomes possible.

The present invention significantly differs from the prior art in that it is possible to attain the normal state, i.e., the switching-OFF-state when the applied magnetic field is zero. Further, the use of the present invention makes it possible to simultaneously control a plurality of switching devices assuming the ON-state and OFF-state by using one control circuit, resulting in a significant effect in improvement of efficiency and controllability of various superconducting apparatuses incorporating switching devices of the present invention.

In a superconducting switching device of the present invention heretofore described, an oxide superconductor having a high critical temperature and having a large electric resistivity under the normal conductive state is used as the switching member instead of a conventional superconducting wire. In particular, this oxide superconductor assumes the superconductive state in a magnetic field belonging to a certain range which does not include zero and assumes the normal conductive state in a magnetic field outside the range. Therefore, it is possible to obtain such a superconducting switching device which performs the favorable switching operation with a weak applied magnetic field.

We claim:

1. A superconducting switching device including a switching member comprising a superconducting wire, and a magnetic field generation section for controlling superconducting-normal conducting transition caused in said switching member, said switching member comprising:

an oxide superconductor having a high critical temperature and having a large electric resistivity value under the normal conductive state.

2. A superconducting switching device including a switching member comprising a superconductor, and a magnetic field generation section for controlling superconducting-normal conducting transition of said switching member, said switching member comprising:

an oxide superconductor assuming the superconductive state in a magnetic field belonging to a certain range, zero being not included in said range, said oxide superconductor assuming the normal conductive state in a magnetic field outside said range.

3. A superconducting switching device comprising:

a switching member including an oxide superconductor;

a coil for applying a bias magnetic field to said switching member; and a magnetic field generating coil for controlling superconducting-normal conducting transition, the polarity of the magnetic field of said bias magnetic field applying coil being opposite to that of said magnetic field generating coil.

4. A superconducting switching device comprising:

a switching member including an oxide superconductor;

a permanent magnet for applying a bias magnetic field to said switching member; and a magnetic field generating coil for controlling superconducting-normal conducting transition, the polarity of the magnetic field of said permanent magnet being opposite to that of said magnetic field generating coil.

5. A superconducting switching device comprising:

a plurality of switching members comprising oxide superconductors;

a bias magnetic field generating section for applying a bias magnetic field to at least one of said switching members; and magnetic field generating coils for controlling superconducting-normal conducting transition of said switching members.

* * * * *